(12) United States Patent
Lai et al.

(10) Patent No.: US 7,391,613 B2
(45) Date of Patent: Jun. 24, 2008

(54) MEMORY MODULE ASSEMBLY INCLUDING A CLAMP FOR MOUNTING HEAT SINKS THEREON

(75) Inventors: Cheng-Tien Lai, Tu Cheng (TW); Zhi-Yong Zhou, Shenzhen (CN); Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 104 days.

(21) Appl. No.: 11/308,839

(22) Filed: May 12, 2006

(65) Prior Publication Data

US 2007/0263359 A1 Nov. 15, 2007

(51) Int. Cl.
*H05K 7/20* (2006.01)

(52) U.S. Cl. ............... 361/700; 361/704; 361/715; 361/719; 257/715; 257/718; 257/719; 174/15.2; 165/80.4; 165/104.26

(58) Field of Classification Search .............. None
See application file for complete search history.

(56) References Cited

U.S. PATENT DOCUMENTS

| | | | | |
|---|---|---|---|---|
| 5,109,318 A | * | 4/1992 | Funari et al. | 361/710 |
| 5,966,287 A | * | 10/1999 | Lofland et al. | 361/704 |
| 6,049,975 A | * | 4/2000 | Clayton | 29/832 |
| 6,119,765 A | * | 9/2000 | Lee | 165/80.3 |
| 6,188,576 B1 | * | 2/2001 | Ali et al. | 361/704 |
| 6,233,150 B1 | * | 5/2001 | Lin et al. | 361/704 |
| 6,535,387 B2 | * | 3/2003 | Summers et al. | 361/704 |
| 6,765,797 B2 | * | 7/2004 | Summers et al. | 361/704 |
| 7,151,668 B1 | * | 12/2006 | Stathakis | 361/700 |
| 2003/0026076 A1 | | 2/2003 | Wei | |
| 2006/0056154 A1 | * | 3/2006 | Foster et al. | 361/700 |
| 2006/0067054 A1 | * | 3/2006 | Wang et al. | 361/704 |

\* cited by examiner

*Primary Examiner*—Boris L Chervinsky
(74) *Attorney, Agent, or Firm*—Jeffrey T. Knapp

(57) ABSTRACT

A memory module assembly includes a printed circuit board (10) having a main heat-generating electronic component (52) thereon, first and second heat sinks (20), (30) attached on opposite sides of the printed circuit board and a clamp (40) clamping the first, second heat sinks and the printed circuit board together. The first heat sink comprises a pair of positioning poles (24). The second heat sink comprises a heat pipe (36) disposed therein and thermally connecting therewith. The clamp comprises a connecting portion (42) and a pair of elastic pressing portions (44). The clamp resiliently presses the second heat sink toward the main heat-generating electronic component and the first heat sink engages with the second heat sink via the positioning poles of the first heat sink extending in and engaging with the second heat sink.

19 Claims, 4 Drawing Sheets

MEMORY MODULE ASSEMBLY INCLUDING A CLAMP FOR MOUNTING HEAT SINKS THEREON

FIELD OF THE INVENTION

The present invention relates generally to memory module assemblies, and more particularly to a memory module assembly including a clamp for mounting a heat sink to an electronic component attached on a surface of a printed circuit board of the memory module assembly.

DESCRIPTION OF RELATED ART

Memory module assemblies that are currently in use generally do not require cooling devices to dissipate heat. The electronic components and memory module assemblies currently available, which are operated on or below 66 MHz do not generate heat that requires a cooling device for dissipating the heat. However, as the industry progresses, memory module assemblies, such SDRAM DIMM memory module assemblies are required to be operated at 100 MHz or more. For these modern memory module assemblies, heat sinks will be required to remove heat generated thereby. However, since the memory module assemblies each have a limited board area and are mounted on a motherboard of a computer, mounting the heat sink to the memory module assembly becomes an issue.

SUMMARY OF INVENTION

A memory module assembly in accordance with a preferred embodiment comprises a printed circuit board having heat-generating electronic components thereon, first and second heat sinks attached on opposite sides of the printed circuit board and a clamp clamping the first, second heat sink and the printed circuit board therebetween. The first heat sink comprises a first body and a pair of positioning poles extending from opposite sides of the first body. The second heat sink comprises a second body and a heat pipe disposed in the second body. The clamp comprises a connecting portion and a pair of elastic pressing portions extending from two free ends of the connecting portion. The pressing portions of the clamp resiliently press the second heat sink toward the heat-generating electronic components and the first heat sink engages with the second heat sink via the positioning poles of the first body extending in the second body.

Other advantages and novel features will become more apparent from the following detailed description of preferred embodiments when taken in conjunction with the accompanying drawings, in which:

BRIEF DESCRIPTION OF DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION

Figure 1:
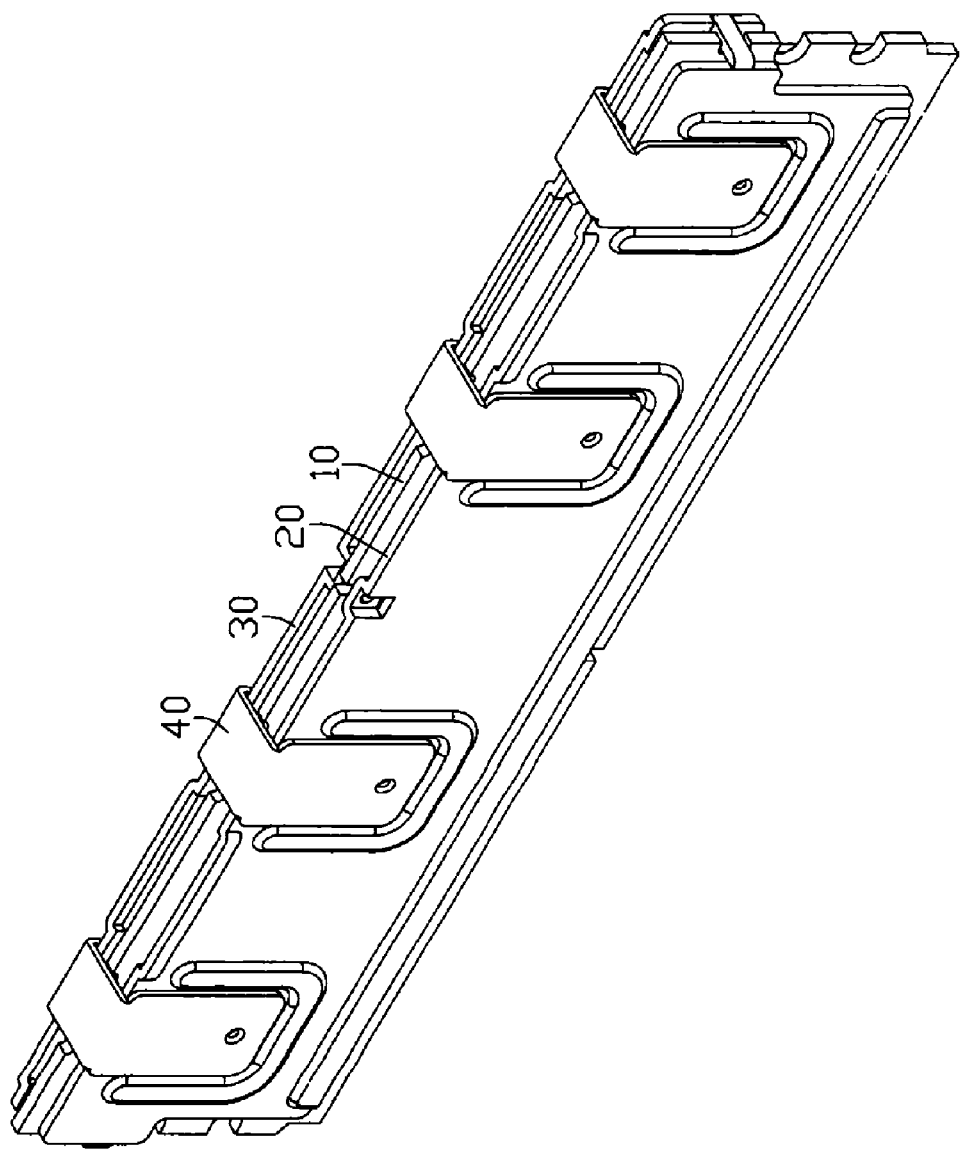
FIG. 1 is an assembled view of a memory module assembly in accordance with a preferred embodiment of the present invention.
Figure 2:
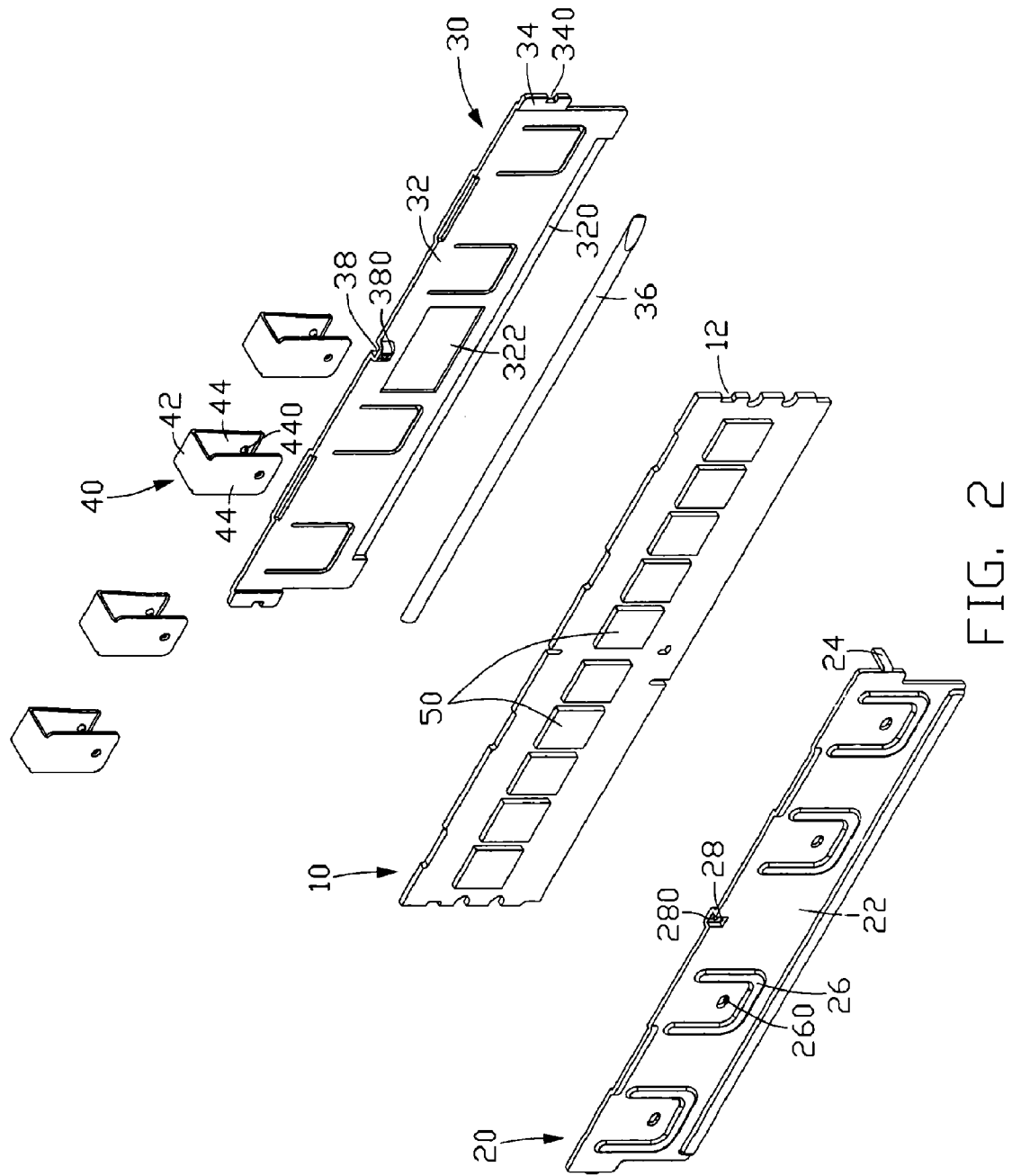
FIG. 2 is an exploded and isometric view of FIG. 1.
Figure 3:
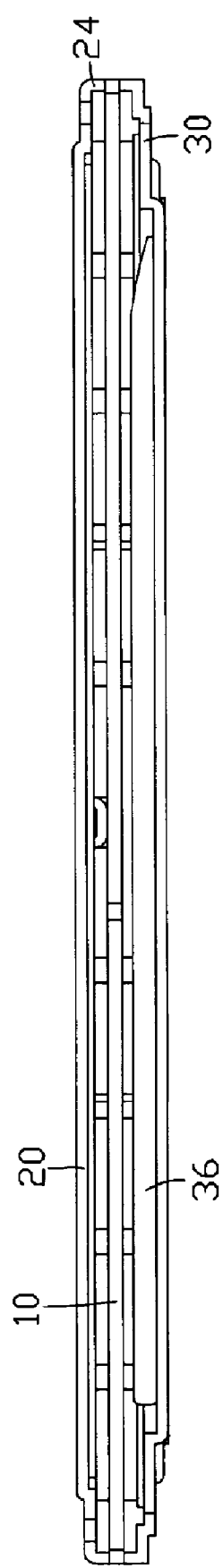
FIG. 3 is a bottom view of FIG. 1.
Figure 4:
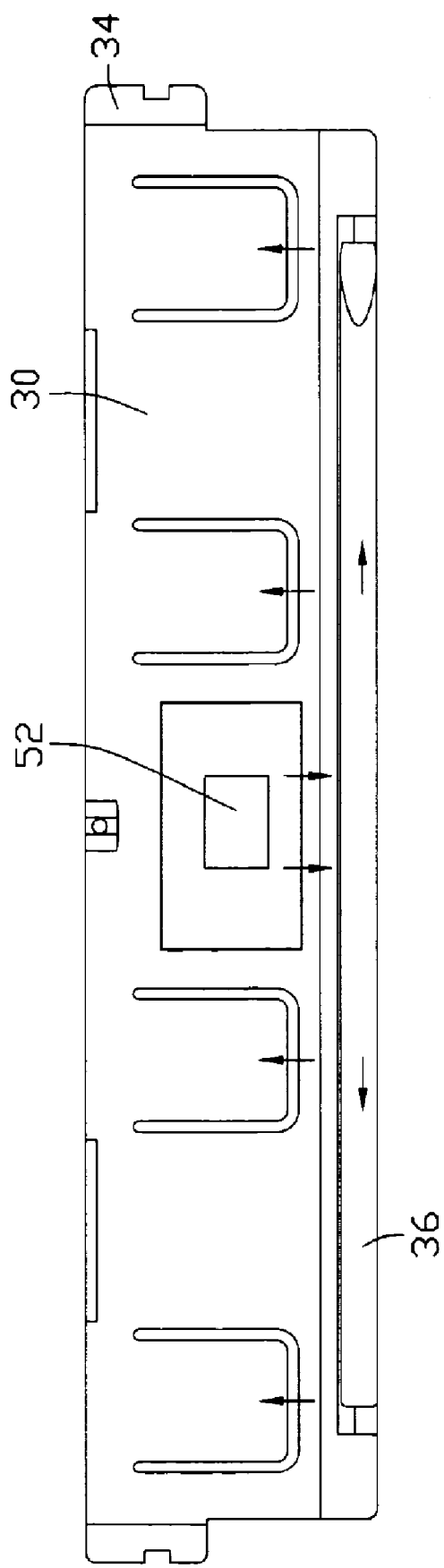
FIG. 4 is a diagrammatic view of the memory module assembly, with arrows showing heat dissipation paths from a main heat-generating electronic component through a heat pipe to a second heat sink of the memory module assembly.

FIGS. 1-2 show a memory module assembly in accordance with a preferred embodiment of the present invention. The memory module assembly comprises a printed circuit board 10 having a plurality of heat-generating electronic components 50 thereon, a first heat sink 20, a second heat sink 30 and four clamps 40 for securing the first and second heat sinks 20, 30 onto opposite sides of the printed circuit board 10. The printed circuit board 10 has a rectangular shape having first and second faces and two long sides and two short sides between the long sides. A pair of openings 12 is defined in edges of the opposite short sides of the printed circuit board 10. The printed circuit board 10 further comprises a main heat-generating electronic component 52 (referring to FIG. 4) producing more heat than any one of the heat-generating electronic components 50. The main heat-generating electronic component 52 is arranged facing the second heat sink 30 and located at a middle of a rear surface of the printed circuit board 10, opposite the heat-generating electronic components 50.

Referring to FIG. 2, the first heat sink 20 comprises a rectangular-shaped first body 22. A pair of positioning poles 24 perpendicularly extends from edges of a pair of opposite short sides of the first body 22. Four U-shaped ribs 26 are positioned with spaces between them on a front surface of the first body 22 to form four receiving regions (not labeled) surrounded by the ribs 26. A depression 260 is defined in a middle of each receiving region for facilitating an engagement with the corresponding clamp 40. A depressed portion 28 is located in an upper end of the front surface of the first body 22 and a through hole 280 is defined in the depressed portion 28 for a fastener, for example, a rivet to extend through to connect the first and second heat sinks 20, 30 together.

The second heat sink 30 comprises a rectangular-shaped second body 32 and a heat pipe 36 arranged in the second body 32 by soldering. A pair of pieces 34 outwardly extends from edges of a pair of short sides of the second body 32. Each piece 34 defines a cutout 340 therein corresponding to the positioning pole 24 of the first body 22. The cutouts 340 are used for the positioning poles 24 to extend through. Four U-shaped ribs (not shown) are positioned with spaces between them on a rear surface of the second body 32 thereby to define four receiving regions (not shown) like those of the first heat sink 20. A depression (not shown) is defined in a middle of each receiving region for facilitating an engagement with its corresponding clamp 40. A depressed portion 38 is defined in an upper end of the rear surface of the body 32 corresponding to the depressed portion 28 in the first body 22 and a through hole 380 is defined in the depressed portion 38. The rivet extends through the through holes 280, 380 to join the first and second heat sinks 20,30 together. A channel 320 is defined in a lower end of the front surface of the second body 32 for accommodating the heat pipe 36 therein. A depressed region 322 is defined in the second heat sink 30 above the channel 320 to accommodate the heat-generating electronic component 52 mounted on the printed circuit board 10. Each clamp 40 has an n-shaped configuration and comprises a connecting portion 42 and a pair of elastic pressing portions 44 extending from two free ends of the connecting portion 42. Each pair of pressing portions 44 forms a pair of opposing tabs 440 extending inwardly from inner surfaces thereof and defines a pair of recesses (not labeled) in outer surfaces thereof corresponding to the tabs 440. The tabs 440 are locked in the depressions 260 and the pressing portions 44 are received in the receiving regions of the first and second heat sinks 20, 30 to avoid movements of the clamps 40 along the long sides of the printed circuit board 10.

In assembly, the heat pipe 36 is accommodated in the channel 320 of the second heat sink 30. The first and second heat sinks 20, 30 respectively contact with the first and second faces of the printed circuit board 10. The second heat sink 30 is attached on the main heat-generating electronic component 52 so that the main heat-generating electronic component 52 is received in the depressed region 322 (referring to FIG. 4). The positioning poles 24 of the first heat sink 20 extend into the openings 12 in the printed circuit board 10 and the cutouts 340 in the second heat sink 30. Then, free ends of the positioning poles 24 extending beyond the rear surface of the second body 32 of the second heat sink 30 are bent to tightly abut against the rear surface of the second body 32. The printed circuit board 10 is sandwiched between the first and second heat sinks 20, 30 by the clamps 40. The pressing portions 44 are received in the receiving regions formed by the U-shaped ribs 26. The tabs 440 of the pressing portions 44 are stopped in the depressions 260. Therefore, the clamps 40 clamp the first, second heat sink 20, 30 and the printed circuit board 10 therebetween.

In operation, when the second heat sink 30 is attached to the main heat-generating electronic component 52, heat generated by the heat-generating electronic component 52 is transferred to a middle portion of the second body 32 of the second heat sink 30 and then downwardly to a middle portion of the heat pipe 36. The heat absorbed in the middle portion of the heat pipe 36 is quickly transferred to opposite end portions of the heat pipe 36 and then transferred to a bottom of the second body 32 attached with the heat pipe 36. Thus the heat is transferred to an upper portion of the second heat sink 30 along the bottom of the second body 32 of the second heat sink 30 and evenly distributed in the whole second body 32 of the second heat sink 30. Accordingly, the heat generated by the main heat-generating electronic components 52 is dissipated quickly. The memory module assembly with the second heat sink 30 accommodating the heat pipe 36 therein distributes the heat from the main heat-generating electronic components 52 evenly over the whole of the second heat sink 30 via the heat pipe 36. Heat-dissipation efficiency of the memory module assembly is correspondingly improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A memory module assembly comprising:
    a printed circuit board having a heat-generating electronic component mounted thereon;
    a first heat sink comprising a first body attached on a side of the printed circuit board and a pair of positioning poles extending from opposite sides of the first body;
    a second heat sink comprising a second body attached on an opposite side of the printed circuit board and a heat pipe disposed in the second body; and
    a clamp comprising a connecting portion and a pair of elastic pressing portions extending from two free ends of the connecting portion;
    wherein the pressing portions clamp the first and second heat sinks attached on the opposite sides of the printed circuit board and resiliently press the second heat sink attached toward the heat-generating electronic component, the first heat sink engaging with the second heat sink via the positioning poles of the first body extending in the second body.

2. The memory module assembly as claimed in claim 1, wherein the heat pipe is sandwiched between the second heat sink and the printed circuit board.

3. The memory module assembly as claimed in claim 1, wherein the second body defines a channel in a lower end portion thereof for accommodating the heat pipe therein and a pair of cutouts in edges of lateral sides thereof corresponding to the positioning poles of the first body, the positioning poles extending in the cutouts.

4. The memory module assembly as claimed in claim 3, wherein the first and second bodies each comprise a U-shaped rib on a surface thereof and the pressing portions of the clamp are surrounded by the U-shaped ribs.

5. The memory module assembly as claimed in claim 4, wherein the first and second bodies each define a depression in a middle of a space inside the U-shaped rib and the pressing portions form a pair of opposing tabs engaging in the depressions.

6. The memory module assembly as claimed in claim 5, wherein the clamp has an n-shaped configuration and the tabs are formed extending inwardly from inner surfaces of the pressing portions and a pair of recesses are defined in outer surfaces of the pressing portions corresponding to the tabs.

7. The memory module assembly as claimed in claim 1, wherein the printed circuit board defines a pair of openings in edges of opposite lateral sides thereof for the positioning poles of the first body extending in.

8. A memory module assembly comprising:
    a printed circuit board having first and second faces and two long sides and two short sides between the long sides, the short sides defining a pair of openings therein, a heat-generating electronic component mounted thereon;
    a first heat sink comprising a rectangular-shaped first body and a pair of positioning poles extending from opposite sides of the first body;
    a second heat sink comprising a rectangular-shaped second body and a heat pipe disposed in the second body, the second body defining a pair of cutouts in opposite edges of opposite sides thereof for the positioning poles to extend in; and
    a pair of substantially n-shaped clamps each having a pair of elastic pressing portions clamping the first and second heat sinks on the first and second faces of the printed circuit board;
    wherein the pressing portions of the clamps resiliently press the second heat sink attached toward the heat-generating electronic component.

9. The memory module assembly as claimed in claim 8, wherein each clamp comprises a connecting portion and the pressing portions extend from two free ends of the connecting portion.

10. The memory module assembly as claimed in claim 8, wherein each pair of the pressing portions forms a pair of opposing tabs extending from inner surfaces of the pressing portions and blocked in the first and second bodies.

11. The memory module assembly as claimed in claim 10, wherein the first and second bodies each define a pair of depressions therein for the tabs to be received in.

12. The memory module assembly as claimed in claim 8, wherein the first and second bodies each form a pair of U-shaped ribs thereon and the pressing portions of the clamps are surrounded by the U-shaped ribs.

13. The memory module assembly as claimed in claim 8, wherein the first and second bodies each define a depressed portion in an upper end thereof and a through hole defined in the depressed portion, a fastener being used to extend through the through holes to connect the first and second bodies together.

14. A memory module assembly comprising:
- a printed circuit board having a plurality of heat-generating electronic components mounted on opposite surfaces thereof;
- a heat sink comprising a pair of individual plates respectively covering the opposite surfaces of the printed circuit board and thermally connecting with the heat-generating electronic components; and
- a heat pipe received between one of the pair of individual plates of the heat sink and the printed circuit board and thermal connecting therewith; wherein heat generated by one of the heat-generating electronic components is first transferred to the heat sink and then the heat pipe to be distributed over the heat sink.

15. The memory module assembly as claimed in claim 14, wherein the one of the heat-generating electronic components is located at a middle of the printed circuit board.

16. The memory module assembly as claimed in claim 15, wherein the one of the heat-generating electronic components generates more heat than any of the other heat-generating electronic components.

17. The memory module assembly as claimed in claim 14, wherein each of the individual pair of plates forms a plurality of U-shaped ribs thereon, the heat pipe being Located remote from opened sides of the U-shaped ribs.

18. The memory module assembly as claimed in claim 17 further comprising a plurality of clamps clamping the pair of individual plates together with the printed circuit board, wherein a pressing portion of each clamp fits in a receiving region surrounded by a corresponding U-shaped rib.

19. The memory module assembly as claimed in claim 14, wherein the one of the pair of individual plates defines a channel accommodating the heat pipe therein.

* * * * *